United States Patent [19]
Brand

[11] Patent Number: 5,866,442
[45] Date of Patent: Feb. 2, 1999

[54] METHOD AND APPARATUS FOR FILLING A GAP BETWEEN SPACED LAYERS OF A SEMICONDUCTOR

[75] Inventor: J. Michael Brand, Boise, Id.

[73] Assignee: Micron Technology, Inc., Boise, Id.

[21] Appl. No.: 789,269

[22] Filed: Jan. 28, 1997

[51] Int. Cl.[6] .......................... H01L 21/44; H01L 21/48; H01L 21/50
[52] U.S. Cl. .......................... 438/108; 438/126; 438/127
[58] Field of Search .................................... 438/108, 126, 438/127, 345, 346, 353, 358, 356

[56] References Cited

U.S. PATENT DOCUMENTS

| | | | |
|---|---|---|---|
| 4,604,644 | 8/1986 | Beckham et al. | 357/80 |
| 4,933,042 | 6/1990 | Eichelberger et al. | 156/239 |
| 4,940,181 | 7/1990 | Juskey, Jr. et al. | 228/180.2 |
| 5,019,673 | 5/1991 | Juskey et al. | 174/52.2 |
| 5,203,076 | 4/1993 | Banerji et al. | 29/840 |
| 5,218,234 | 6/1993 | Thompson et al. | 257/787 |
| 5,258,648 | 11/1993 | Lin | 257/778 |
| 5,311,059 | 5/1994 | Banerji et al. | 257/778 |
| 5,352,629 | 10/1994 | Paik et al. | 437/189 |
| 5,371,404 | 12/1994 | Juskey et al. | 257/659 |
| 5,385,869 | 1/1995 | Liu et al. | 437/209 |
| 5,410,181 | 4/1995 | Zollo et al. | 257/681 |
| 5,438,219 | 8/1995 | Kotzan et al. | 257/469 |
| 5,439,162 | 8/1995 | George et al. | 228/180.22 |
| 5,442,240 | 8/1995 | Mukerji | 257/783 |
| 5,450,283 | 9/1995 | Lin et al. | 361/704 |
| 5,468,995 | 11/1995 | Higgins, III | 257/697 |
| 5,697,148 | 12/1997 | Lance, Jr. et al. | . |
| 5,710,071 | 12/1995 | Beddingfield et al. | 438/108 |

*Primary Examiner*—John F. Niebling
*Assistant Examiner*—David A. Zarneke
*Attorney, Agent, or Firm*—Trask, Britt & Rossa

[57] ABSTRACT

A semiconductor device assembly with a gap to be filled has thermal vias formed in the supporting substrate. After the semiconductor device is connected to the substrate and fill material positioned about the gap to create a seal, a vacuum is drawn through the thermal vias and a pressure applied to the fill material to urge the fill material into the interior of the gap.

3 Claims, 2 Drawing Sheets

METHOD AND APPARATUS FOR FILLING A GAP BETWEEN SPACED LAYERS OF A SEMICONDUCTOR

BACKGROUND OF THE INVENTION

1. Field of the Invention

This invention relates to a method and apparatus for underfilling the gap between a semiconductor device mounted on a substrate, such as a flip chip semiconductor device mounted on a substrate.

2. State of the Art

A flip chip semiconductor device mounted on a substrate is one type of arrangement having a gap formed between the flip chip semiconductor device and the substrate. A semiconductor device is said to be a "flip chip" because it is manufactured in wafer form having its active surface having, in turn, bond pads thereon initially facing upwardly. After manufacture is completed and the semiconductor device singulated from the wafer, it is "flipped" over such that the active interior surface faces downwardly for attachment to a substrate. For attachment to a substrate a flip chip semiconductor device is formed having bumps on the bond pads of the active surface thereof which are used as electrical and mechanical connectors with the substrate. Several materials may be used to form the bumps on the flip chip semiconductor device, such as various types of solder and alloys thereof, conductive polymers, etc. In applications using solder bumps, the solder bumps are reflowed to form a solder joint between the flip chip semiconductor device and the substrate. The solder joint thereby forming both the electrical and mechanical connections between the semiconductor device and the substrate. Because of the presence of the bumps, a gap is formed between the semiconductor device and the substrate.

Since the semiconductor device and the substrate are typically formed of differing materials, the semiconductor device and the substrate have different mechanical properties with differing attendant reactions to operating conditions and mechanical loading thereby causing stress to develop in the bumps connecting the semiconductor device to the substrate. Therefore, the bumps are typically made of sufficient robust size to withstand such anticipated stressful conditions thereby causing a substantial gap to be created between the semiconductor device and the substrate. To enhance the joint integrity between the semiconductor device and the substrate a fill material is introduced into the gap therebetween. The fill material, called an underfill material, helps equalize stress placed on the solder bumps, the semiconductor device, and the substrate as well as helping to the bumps and other electrical features of the semiconductor device and the substrate be maintained free from contaminants, including moisture, chemicals, chemical ions, etc.

In some applications, the fill material is typically dispensed into the gap between the semiconductor device and the substrate by injecting the fill material along one, two, or more sides with the underfill material flowing, usually by capillary action to fill the gap. For example, U.S. Pat. No. 5,214,234 (Thompson et al.) discloses a semiconductor device assembly where an epoxy fill material is injected around the perimeter of the chip mated on the substrate. The epoxy material has a viscosity permitting it to flow into the gap. A hole may be provided in the substrate to facilitate positioning the material into the gap.

It has been noted that underfilling the gap by way of capillary action may lead to non-uniform disposition of the fill material within the gap. Typically, the fill material may have bubbles, air pockets or voids. Non-uniform disposition of the material in the gap decreases the fill material's ability to protect the interconnections between the semiconductor device and the substrate and may lead to a reduction in the reliability of the semiconductor device.

In some arrangements, such as those disclosed in U.S. Pat. No. 5,410,181 (Zollo et al.), a hole in the substrate is provided through which access may be had to the circuit for performing various operations thereon, including optical operations associated with the circuit. A plug is positioned in the hole which precludes positioning the fill material in the area associated with the plug. That is the fill material is inserted with the plug in place in the hole.

U.S. Pat. No. 5,385,869 (Liu et al.) discloses a device in which a gap between the semiconductor device and the substrate is underfilled by forming a large hole through the substrate. The hole may even have gates or notches formed at each corner which extend beyond the hole. The underfill material flows through the hole by way of the gates or notches in the substrate in order to facilitate complete underfilling.

U.S. Pat. No. 5,203,076 (Banerji et al.) teaches one to apply a vacuum to evacuate air from the gap between the chip and the substrate. Air is then slowly allowed to reenter the vacuum to force the underfill material into the gap between the semiconductor device and the substrate.

Underfilling may also be seen in the manufacture of semiconductor devices illustrated in U.S. Pat. No. 5,371,404 (Juskey et al.), U.S. Pat. No. 5,258,648 (Lin), U.S. Pat. No. 5,311,059 (Banerji et al.) and U.S. Pat. No. 5,438,219 (Kotzan et al.).

As previously stated, semiconductor devices that are underfilled or filled with a material in the gap between the semiconductor device and the supporting substrate frequently encounter non-uniform disposition of the fill material. Therefore, improved underfilling methods that improve the quality of the underfilling of the gap between the flip chip type semiconductor device and the substrate, that are cost effective, and that use improved and lower cost fill materials are desired.

SUMMARY OF THE INVENTION

In a preferred arrangement of the invention, a semiconductor device assembly includes a flip chip semiconductor device and a substrate having a plurality of thermal vias therein. The flip chip semiconductor device having an first exterior surface and having a second active interior surface having, in turn, bond pads thereon including solder bumps thereon as electrical and mechanical interconnection structure. The substrate comprises a substrate having a metallized surface pattern of electrical circuits thereon for connection with the interconnection structure of flip chip semiconductor device and plurality of thermal vias extending therethrough. After the interconnection structure of the flip chip semiconductor device is connected to portions of the metallized surface of the substrate, a fill material is used to fill the gap between the flip chip semiconductor device and the substrate by applying a vacuum through the thermal vias in the substrate and, if desired, fluid pressure to the fill material. Preferably the fill material includes a filler.

A method of making a semiconductor device assembly comprises providing a semiconductor device having a first surface and a second active interior surface. The second active interior surface having one or more bond pads thereon having, in turn, electrical interconnection structure formed thereon and extending therefrom. A substrate includes one side thereof having a metallized surface pattern of electrical circuits thereon for contact with the electrical interconnection structure of the bond pads of the semiconductor device and another exterior surface spaced from the metallized surface. A plurality of thermal vias extend through the substrate from the metallized surface to the other exterior surface. The thermal vias are sized and configured for heat transfer from the gap adjacent the metallized surface of the substrate to the other exterior surface of the substrate. The semiconductor device is connected to portions of the metallized surface of the substrate having the electrical interconnection structure of the bond pads of the semiconductor device contacting the desired portions of the metallized surface of the substrate thereby forming a gap having a perimeter therebetween. Fill material is positioned proximate at least a portion of the perimeter of the gap between the metallized surface and the second surface of the semiconductor device. A source of vacuum is positioned proximate the exterior surface of the substrate relative to the thermal vias to draw a vacuum through the thermal vias to urge the fill material into the gap.

If desired, a source of pressure may be provided and positioned to apply pressure against the fill material, in addition to the vacuum, to further urge the fill material into the gap.

Preferably, the electrical interconnection structure is a plurality of bumps formed on the second active surface of the semiconductor device. The fill material may include suitable fillers in combination with suitable electrical insulating material. The thermal vias may be typically sized in diameter from 0.001 inches to 0.010 inches.

The present invention also includes apparatus for filling the gap between a semiconductor device and a substrate of a semiconductor device assembly. The apparatus includes a supporting structure to support the semiconductor device assembly. The semiconductor device assembly having a first surface spaced from the second active interior surface having, in turn bond pads thereon including interconnection structure thereon thereby forming a first portion of the gap defined between the semiconductor device and the substrate. The substrate having an internal metallized surface pattern of electrical circuits forming a second portion of the gap, a thickness, and an external surface. A plurality of thermal vias are formed between the internal metallized surface and the external surface of the substrate. Fill apparatus is provided for positioning fill material proximate a portion of the gap about the perimeter thereof. A pressure chamber is positioned about the external surface of the semiconductor device being configured to apply fluid pressure about the perimeter of the gap and against the fill material to urge the fill material into the gap.

A vacuum chamber is also positioned about the external surface of the substrate. The vacuum chamber is configured to draw a vacuum in the gap through the thermal vias to urge the fill material into the gap. Additionally, pressure source apparatus is preferably connected to the pressure chamber to supply fluid (e.g., gas) under pressure and to maintain such fluid at a desired pressure. A vacuum source is connected to the vacuum chamber to draw vacuum and to maintain the vacuum at a selected vacuum pressure.

DETAILED DESCRIPTION OF THE ILLUSTRATED EMBODIMENT

Figure 1:
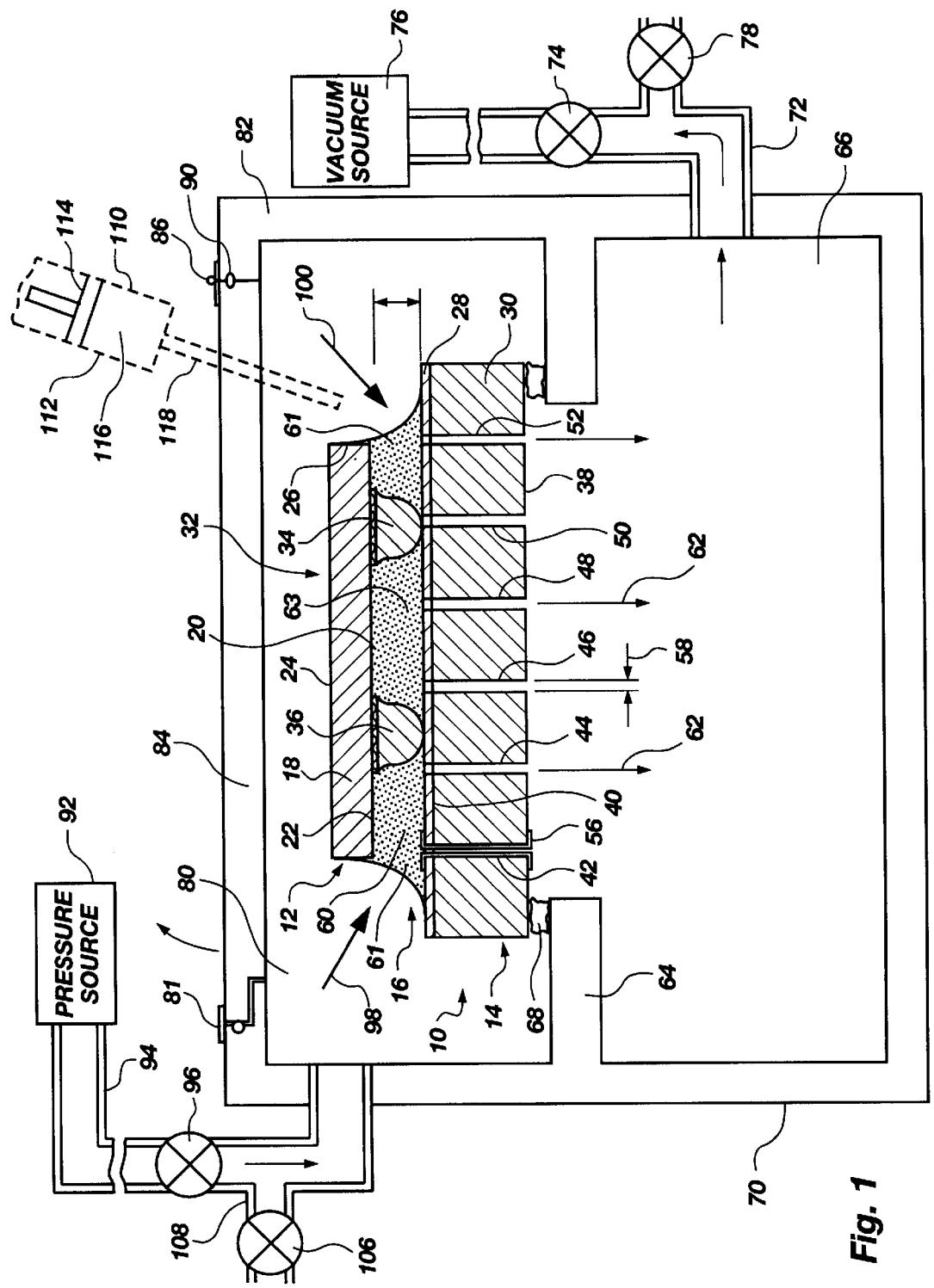
FIG. 1 is a simplified depiction of an apparatus used for practicing the method of the present invention as well as a semiconductor device of the present invention.

Referring to drawing FIG. 1, the apparatus as well as a semiconductor device assembly 10 of the present invention are schematically illustrated.

A semiconductor device assembly 10 is shown having a semiconductor device 12 spaced from a substrate 14 to define a gap 16 thereinbetween. As illustrated, the semiconductor device 12 includes a base 18 and a second active interior surface 22 having bond pads 20 thereon. The semiconductor device 12 may be any suitable type flip chip semiconductor device.

In FIG. 1, the active second interior surface 22 of the semiconductor device 12 is shown opposite the exterior surface 24 of the base 18. As shown, the second active interior surface 22 and exterior surface 24 are spaced apart, generally aligned, forming the base 18 having exterior side wall 26. The base 18 may be of any suitable desired geometric shape and thickness.

The bond pads 20 on the second active interior surface 22 of the semiconductor device 12 may be formed in a variety of desired configurations known to those in the art. The bond pads 20 may also include various interconnection structure for connection to the metallized surface pattern of electrical circuits 28 on interior surface 40 of the substrate 14. The substrate 14 may be any acceptable substrate used for mounting and receiving a semiconductor device 12 comprised of the base 18 having bond pads 20 and interconnecting structure thereon, such as an FR-4 type substrate board.

As illustrated, the interconnecting structure comprises a plurality of solder bumps, such as solder bumps 34 and 36, which are positioned to contact desired locations on the metallized surface pattern of electrical circuits 28 associated with interior surface 40 of substrate 14 facing inwardly toward the gap 16.

The semiconductor device assembly 10 illustrated is a flip chip semiconductor device which includes a semiconductor chip 12 "flipped" to have its connective structure and, more particularly, the solder bumps 34 and 36 aligned with and attached to desired connecting points of the metallized surface pattern of electrical circuits 28 of the substrate 14. The solder bumps 34 and 36 are preferably flowed together using any suitable type of heating for securing the semiconductor device 12 to the metallized surface pattern of electrical circuits 28 of the substrate 14.

The substrate 14 also has an exterior surface 38 spaced from the interior surface 40, more particularly, the metallized surface pattern of electrical circuits 28, to provide a rigid substrate for supporting the semiconductor device 12. Substrate 14 may of any suitable geometric configuration and thickness suitable for use with the semiconductor device 12.

The substrate 30 is formed having a plurality of thermal vias, such as thermal vias 42, 44, 46, 48, 50 and 52. The thermal vias are formed in a predetermined configuration and in sufficient quantity, such as those illustrated in FIG. 2, to remove a predetermined amount of heat from the gap 16. More specifically, in FIG. 2, the substrate 30 is shown with a plurality of thermal vias in a predetermined pattern or matrix 54. The number of thermal vias formed is selected based on the amount of heat, the nature of the circuit, the type of substrate, the type of circuitry on the substrate, and other such factors as known to those in the art. The thermal vias may be formed in any desired configuration necessary to effect transfer of heat from the semiconductor device 12 and the connection thereof to the substrate 14 and, more particularly, the transfer of heat from the gap 16 to exterior the substrate 30.

As shown in FIG. 1, the thermal vias 42, 44, 46, 48, 50 and 52 each may have a separate metallized interior 56. The metallized interior 56 to facilitate heat transfer from the interior surface 40, the metallized surface pattern of electrical circuits 28, and the gap 16 to exterior the substrate 14 of the semiconductor device assembly 10. That is, each of the thermal vias, such as thermal via 42, may have the interior thereof metallized, as shown at 56, to facilitate heat transfer.

Figure 2:
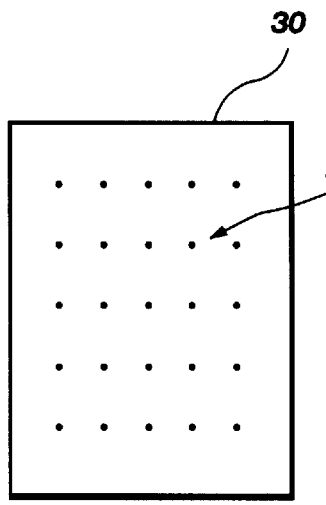
FIG. 2 is an illustration of the exterior surface of a substrate of a semiconductor device involved in the present invention.

The thermal vias such as vias 42, 44, 46, 48, 50 and 52, as well as those appearing in the matrix 54 illustrated in drawing FIG. 2, preferably are cylindrical in shape having a diameter from about a 0.001 inches to about 0.010 inches. The thermal vias 42, 44, 46, 48, 50 and 52, as well as those in the matrix 54, being formed by well known acceptable techniques.

In reference to FIG. 1, solder bumps 34 and 36 may be formed from various types of solder and various alloys thereof, conductive polymer, other materials known in the art such as gold, indium, silver, platinum and various alloys thereof, any one of which are selected to facilitate flow or reflow thereof to make the desired electrical interconnections.

Also, as shown in FIG. 1, a fill material 60, referred to as an underfill material, is shown positioned in the gap 16 between the semiconductor device 12 and the substrate 14. That is, the material 60 is positioned to seal the active surface 20 of the semiconductor device 12, as well as the solder bumps 34 and 36 and the metallized surface 28. The fill material may be selected to enhance the mechanical bond between the semiconductor device 12 and the substrate 14, to help distribute stress on the semiconductor device 12 and the solder bumps 34 and 36, and to increase structural rigidity and, in turn, facilitate longer life and reduce damage from physical shock to the semiconductor device assembly 10. The fill material also helps protect the semiconductor device 12 and substrate 14 from contaminants, including moisture, chemicals, chemical ions, and the like.

The fill material 60 is typically a polymeric material, such as an epoxy or acrylic resin, that may contain various types of inert fillers. The fill material 60 is typically selected to have a thermal coefficient of expansion that approximates that of the semiconductor device 12 and/or the substrate 14 to help minimize the stress placed on the semiconductor device assembly 10 and, more particularly, on the semiconductor device 12 in relation to the substrate 14 in differing thermal conditions.

To promote filling the gap 16, the viscosity of the fill material 28 is controlled and selected to facilitate the flow thereof to the interior of the gap 16. That is, it is desirable for the fill material 60 to easily, readily flow to fully fill the volume of the gap 16 while minimizing voids, bubbles and non-uniform disposition of the fill material in the gap 16.

For the semiconductor device assembly 10 of FIG. 1, a vacuum is provided proximate the thermal vias in order to draw material in and around the gap 16 to exterior the substrate 14. Thereby, the vacuum urges the fill material 60 from the gap perimeter 61 into the interior of the gap 16 to uniformly dispose fill material 60 throughout the gap 16. The perimeter 61 of the gap 16 being defined by the geometry of the semiconductor device 12. As illustrated, in FIG. 1, the perimeter extends around all sides of the semiconductor device 12. If desired, the fill material may be provided about a portion of the perimeter 61, rather than the entire perimeter 61.

As illustrated in FIG. 1, apparatus may be provided to facilitate construction of the desired semiconductor device assembly 10. As illustrate, the apparatus is shown in simplified form with a support 64, configured to receive and support a semiconductor device assembly 10 thereon. For example, semiconductor device assembly 10 may be placed on the support 64 and supported by a sealing device 68 to minimize leakage of fluids thereby, such as air. All or a portion of the thermal vias 42, 44, 46, 48, 50 and 52, alternately at least a portion of the thermal vias of the matrix 54 shown in FIG. 2, are exposed or uncovered and face into a vacuum chamber 66.

As here shown, the vacuum chamber 66 is formed by an exterior wall 70 which may be domed, rectangular or in any convenient desired shape.

The vacuum chamber 66 has an evacuation line 72 interconnected through the wall 70. A vacuum valve 74 is interconnected in the evacuation line 72 to interconnect the chamber 66 with a vacuum source 76.

The vacuum source 76 may be of any convenient type of industrial vacuum source. For instance, it may be a simple vacuum pump designed or configured to draw a vacuum (e.g., one or more atmospheres) to facilitate the flow of the fill material 60 from the perimeter 61 to the interior 63 of the gap 16 without imposing undesired stress on the substrate 30 and the semiconductor chip 12. However, a vacuum valve 74 is provided and may be used to isolate the vacuum chamber 66 from the vacuum source 76. A bleed valve 78 is provided interconnected into the evacuation line 72 to allow the vacuum to be relieved therethrough.

It must be stated that the term "vacuum" as used herein, is used to describe the removal of gas or other matter from the vacuum chamber 66 to create a negative pressure; i.e., a pressure less than atmospheric pressure within the vacuum chamber 66.

A pressure chamber 80 is formed by a sidewall 82, which may be, if desired, connected to the sidewall 70 forming the vacuum chamber. The sidewall 82 may be formed in any particular desired shape, including hemispheric, rectilinear or the like, to create a chamber into which a fluid pressure may be exerted as hereinafter described.

As illustrated in FIG. 1, the sidewall 82 of the pressure chamber 80 is an extension of the sidewall 70 of the vacuum chamber 66 since both may be unitarily formed with the support 64 thereby resulting in the pressure chamber 80 and the vacuum chamber 66 all being a single structure. As illustrated, the pressure chamber 80 includes a lid 84, secured by a hinge 86, and held closed by a latch 81. When closed, the lid 84 is sealed by an o-ring 90. Other types of suitable seal configurations may be used to provide a sealing relationship for the lid 84, as desired.

The lid 84 is sized to facilitate positioning and removal of a semiconductor device assembly 10 into and out of pressure chamber 80, as illustrated. With the lid 84 secured as illustrated in FIG. 1, pressure may be supplied by a pressure source 92, such as a small compressor or a source of pressurized gas, through a pressure line 94 and a pressure isolation valve 96. Pressure, particularly using a suitable gas, is used to provide a force 98 and 100 against the fill material 60 positioned proximate the perimeter 61 of the gap 16 to urge the fill material 60 toward the interior 63 of the gap 16. Thus, it can be seen that a differential pressure is created between the pressure 98, 100 applied in the pressure chamber 80 and the vacuum 62 drawn in the interior 63 of the gap 16 through vias 46, 48 by way of the vacuum chamber 66. In view of the differential pressure, the applied vacuum pressure force urges the fill material 60 toward the interior 63 of the gap 16 is enhanced so that fill material may be selected to reduce cost, enhance strength, and facilitate complete filling of the gap 16. Further, the evacuation of the interior 63 of the gap 16 eliminates the need to provide a way for trapped air to escape upon movement of fill material 60 toward the interior 63. Also it is believed that the use of a vacuum to fill the gap 16 helps reduce the number of bubbles in the fill 60 and helps provide a more uniform distribution of fill 60 in the gap 16.

In referring to the pressure chamber 80, it may be noted that a bleed valve 106 is provided to vent the pressure that is built up to the interior of the pressure chamber 80 upon operation of the pressure source and positioning the valve 96 in the open position. That is, the pressure in chamber 80 may be relieved before opening the lid 84.

It may be noted that the valves 106, 96, 78 and 74 are here shown in simplified schematic form with an open circle representing a valve in an open position and with a circle having a cross through representing a valve it in a closed position. Any suitable desired valve may be used consistent with the pressures being used.

It may be noted that the source of pressure may provide air, gas, or any other suitable fluid to apply pressure. In practice, it may be desired to use inert gas, including, for example, dry nitrogen.

Figure 3:
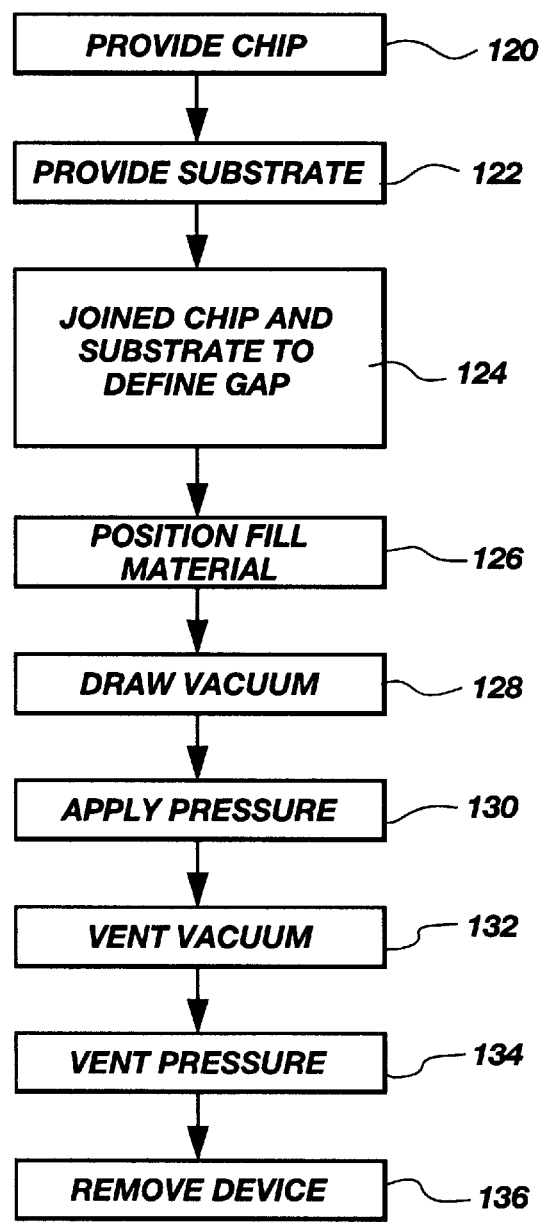
FIG. 3 is a flow diagram illustrating the method of the present invention.

Referring to drawing FIG. 3, to practice a method of making a semiconductor device assembly 10 using the disclosed apparatus, a semiconductor device 12 and a substrate 14, as shown in blocks 120 and 122, are positioned relative to each other, as illustrated in FIG. 1. The semiconductor device 12 is connected at 124 to the substrate 14, preferably by reflowing the solder bumps 34 and 36. The substrate 14 and the semiconductor device 12 are then supported on the support 64 engaging seal 68. The semiconductor device 12 connected to the substrate 14 defining a gap 16 to be filled. On the perimeter 61 of the gap 16, a fill material 60 is positioned by a filling device 110, as illustrated in FIG. 1 to be a cylinder 112 with a piston 114 operable to urge fill material 116 outward through applicator tube 118. Other structures or devices may be used to position the fill material 60 about the perimeter 61 as desired.

The fill material 60 is preferably positioned, as indicated at 126, about the perimeter 61 prior to placement in the pressure chamber 80 proximate the vacuum chamber 66. However, in some situations it may be appropriate to apply the fill material after the semiconductor device 12 and substrate 14 are connected and positioned on the support 64.

After positioning the semiconductor device 12 and substrate 14 as represented by blocks 120 and 122 on the support 64, when they are connected as shown by block 124, thereafter, a vacuum 62 may be drawn 128 in vacuum chamber 66 by operation of the valve 74, 78 and the vacuum source 76. That is, the gas or air in the vacuum chamber 66 and in the gap 16 may be evacuated through the evacuation line 72 to create a vacuum, pressure less than atmospheric pressure, within the vacuum chamber 66 and in the gap 16.

Either simultaneously or sequentially, but preferably substantially simultaneously, a pressure is applied 130 from the pressure source 92 through the pressure line 94 and valve 96 to the pressure chamber 80. The pressure applies a force illustrated in phantom by arrows 98 and 100, as illustrated in drawing FIG. 2, against the fill material 60 to help urge the fill material towards the interior 63 of the gap 16. After the pressure 98 and 100 has been applied and the vacuum 62 has been applied to the lower surface 38 and, more particularly, through the thermal vias 42, 44, 46, 48, 50 and 52 to the interior 63 of the gap 16, for a selected period of time determined by experimentation for the selected fill material, the valves 74 and 96 are closed and the vent valves 106 and 78 are opened to relieve the vacuum 62 and to release the pressure within the respective vacuum chamber 66 and pressure chamber 80 as illustrated by blocks 134 and 136. Thereafter, the lid 84 is opened and the semiconductor device assembly 10 removed 136 therefrom.

While the present invention has been described in terms of certain methods, embodiments and apparatus, it should not be construed to be so limited. Those of ordinary skill in the art will readily recognize and appreciate that additions, deletions and modifications to the embodiments described herein may be made without departing from the scope of the invention as hereinafter defined.

What is claimed is:

1. A method of making a semiconductor device assembly, said method comprising the steps of:

providing an enclosed chamber;

providing a source of fluid under pressure;

providing a semiconductor device having a first surface and a second active interior surface having electrical interconnection structure formed thereon extending outwardly therefrom;

providing a substrate having a metallized surface pattern of electrical circuits for contact with said electrical interconnection structure of said semiconductor device, said substrate having an exterior surface spaced from said metallized surface pattern of electrical circuits and a plurality of thermal vias extending through said metallized surface pattern of electrical circuits to said exterior surface;

placing the semiconductor device in the chamber;

placing the substrate in the chamber;

positioning said semiconductor device proximate said substrate with said interconnection structure in contact with a portion of the metallized surface pattern of electrical circuits of said substrate thereby forming a gap between said semiconductor device and said substrate, said gap having a perimeter;

connecting a portion of said electrical interconnection structure of said semiconductor device to a portion of the metallized surface pattern of electrical circuits of said substrate thereby forming an electrical circuit;

providing a source of fill material in the chamber;

placing fill material proximate the perimeter of said gap;

pressurizing the chamber with the fluid under pressure;

providing a source of vacuum on an opposite side of said substrate from the chamber; and positioning the exterior surface of said substrate relative to said source of vacuum and positioning the perimeter of said gap relative to said source of fluid under pressure for said vacuum to draw through at least one of said thermal vias and with said fluid under pressure and said vacuum urging said fill material from said perimeter into said gap.

2. The method of claim 1, wherein said electrical interconnection structure includes a plurality of bumps.

3. A method of backfilling a flip-chip gap with fill material, said method comprising:

provoding a flip chip semiconductor device assembly, said semiconductor device assembly including a flip chip semiconductor device having interconnection structure thereon mounted on a substrate to define a gap therebetween, said gap having a perimeter, said substrate having at least one thermal via of a plurality of thermal vias formed therein to extend between said gap and an external surface of said substrate;

providing a support for said flip chip semiconductor device assembly;

providing a pressure chamber connected to said support;

providing a source of pressure;

connecting said source of pressure to said pressure chamber to supply a fluid under pressure thereto;

providing a vacuum chamber connected to said support;

providing a source of vacuum;

connecting said source of vacuum to said vacuum chamber to draw a vacuum therein;

providing a source of fill material in said pressure chamber;

positioning a fill material about the perimeter of said gap;

positioning said flip chip semiconductor device assembly having said fill material about the perimeter of said gap in said pressure chamber and with thermal vias extending into said vacuum chamber;

operating said source of pressure to create a pressure in said pressure chamber to urge said fill material into said gap; and simultaneously operating said source of vacuum to draw a vacuum in said vacuum chamber and in said gap through said thermal vias to urge said fill material into said gap.

* * * * *

UNITED STATES PATENT AND TRADEMARK OFFICE
CERTIFICATE OF CORRECTION

PATENT NO. : 5,866,442
DATED : February 2, 1999
INVENTOR(S) : Brand

It is certified that error appears in the above-identified patent and that said Letters Patent is hereby corrected as shown below:

Title page,
Item [21], "Appl. No.:" change "789,269" to -- 08/789,269 --.

Column 1,
Line 51, delete "to";
Line 60, change "5,214,234" to -- 5,218,234 --.

Column 2,
Line 48, change "having an" to -- has a --;
Line 49, delete "having";
Line 55, change "device and plurality" to -- devices and a plurality --;
Line 66, change "having" to -- has --;
Line 67, change "having," to -- which has, --;

Column 3,
Line 6, change "extend" to -- extends --;
Line 37, change "having" to -- has --;
Line 39, change "having," to -- which has, --;
Line 42, change "having" to -- has --;
Line 45, change "are" to -- is --;
Line 60, after "draw" insert -- a --;

Column 4,
Line 30, change "structure" to -- structures --;
Line 58, after "may" insert -- be --;

Column 5,
Line 13, delete "to" and change "facilitate" to -- facilitates --;
Line 25, change "being" to -- are --;
Line 38, change "20" to -- 22 --;
Line 39, after "surface" insert -- pattern of electrical circuits --;
Line 59, change "28" to -- 60 --;
Line 60, after "interior" insert -- 63 --;
Line 61, change "easily, readily" to -- easily and readily --;

UNITED STATES PATENT AND TRADEMARK OFFICE
CERTIFICATE OF CORRECTION

PATENT NO. : 5,866,442
DATED : February 2, 1999
INVENTOR(S) : Brand

It is certified that error appears in the above-identified patent and that said Letters Patent is hereby corrected as shown below:

Column 6,
Line 1, change "Thereby, the" to -- The --;
Line 2, after "interior" insert -- 63 --;
Lines 3-4, change "16. The perimeter" to -- 16, the perimeter --;
Line 12, change "illustrate," to -- illustrated, --;
Line 19, change "alternately" to -- alternatively, --;
Line 23, change "wall 70" to -- sidewall 70 --;
Line 26, change "wall 70" to -- sidewall 70 --;
Line 42, change "pressure; i.e., a" to -- pressure, i.e., a --;
Line 54, after "support 64" insert -- , --;

Column 7,
Line 2, delete "a" and change "force" to -- forces --;
Line 6, change "pressure" to -- pressures --;
Line 10, before "urges" insert -- which --;
Line 18, after "fill" insert -- material --;
Line 19, after "fill" insert -- material --;
Line 23, after "source" insert -- 92 --;
Line 29, delete "it";
Line 44, change "seal 68. The" to -- sealing device 68, the --;
Line 62, change "of the valve 74, 78" to -- of valves 74, 78 --;

Column 8,
Line 6, change "FIG. 2," to -- FIG. 1, --;
Line 8, change "pressure" to -- pressures -- and change "has" to -- have --;
Line 11, after "gap 16" delete ",";
Line 13, change "vent" to -- bleed --;
Line 16, change "134" to -- 132 --; and
Line 17, change "136." to -- 134. --.

UNITED STATES PATENT AND TRADEMARK OFFICE
CERTIFICATE OF CORRECTION

PATENT NO. : 5,866,442
DATED : February 2, 1999
INVENTOR(S) : Brand

It is certified that error appears in the above-identified patent and that said Letters Patent is hereby corrected as shown below:

Column 10, claim 3,
Line 16, after "through said" insert -- at least one of said plurality of --.

Signed and Sealed this

Twentieth Day of November, 2001

Attest:

*Attesting Officer*

NICHOLAS P. GODICI
*Acting Director of the United States Patent and Trademark Office*